(12) United States Patent
Oliveira et al.

(10) Patent No.: US 11,630,187 B2
(45) Date of Patent: Apr. 18, 2023

(54) ENCLOSURE FOR AN OPTOELECTRONIC SENSOR AND LIDAR SENSOR

(71) Applicant: Robert Bosch GmbH, Stuttgart (DE)

(72) Inventors: Joao Oliveira, Fao (PT); Annemarie Holleczek, Stuttgart (DE); Miguel Ferreira, Braga (PT)

(73) Assignee: ROBERT BOSCH GMBH, Stuttgart (DE)

(*) Notice: Subject to any disclaimer, the term of this patent is extended or adjusted under 35 U.S.C. 154(b) by 439 days.

(21) Appl. No.: 16/815,139

(22) Filed: Mar. 11, 2020

(65) Prior Publication Data
US 2020/0309913 A1    Oct. 1, 2020

(30) Foreign Application Priority Data

Mar. 27, 2019 (EP) ..................................... 19165415

(51) Int. Cl.
| | |
|---|---|
| F28D 15/02 | (2006.01) |
| H05K 7/20 | (2006.01) |
| G01S 7/481 | (2006.01) |
| F28C 3/00 | (2006.01) |
| H02K 9/22 | (2006.01) |

(52) U.S. Cl.
CPC ............ *G01S 7/4813* (2013.01); *F28C 3/005* (2013.01); *H05K 7/202* (2013.01); *H05K 7/20136* (2013.01); *H05K 7/20336* (2013.01); *H02K 9/225* (2021.01)

(58) Field of Classification Search
CPC .......... H05K 7/20336; H05K 7/20163; H05K 7/202; H05K 7/20136; F28D 2015/0291; F28D 15/0275; F28D 15/0208; F28D 15/02
See application file for complete search history.

(56) References Cited

U.S. PATENT DOCUMENTS 3,999,400 A * 12/1976 Gray .................... F28D 15/0208
62/499
4,133,230 A * 1/1979 Inaba .................... B23Q 11/127
82/900

(Continued)

FOREIGN PATENT DOCUMENTS

| DE | 2065680 A1 | 1/1975 |
|---|---|---|
| DE | 4225676 A1 | 2/1994 |

*Primary Examiner* — Frantz F Jules
*Assistant Examiner* — Jason N Thompson
(74) *Attorney, Agent, or Firm* — Norton Rose Fulbright US LLP; Gerard Messina

(57) ABSTRACT

An enclosure for an optoelectronic sensor. The enclosure includes a thermodynamically open first chamber; a thermodynamically closed second chamber; and a rotor extending from the first chamber into the second chamber. The rotor includes a shaft part in the second chamber coaxial to the rotational axis of the rotor. The shaft part mounts an optoelectronic sensor device. The rotor includes a head part in the first chamber coaxial to the rotational axis of the rotor. A heat dissipation fan is fixedly arranged on and surrounds the head part. The head part and the fan are rotatably and thermally coupled to the shaft part to rotate simultaneously with the shaft part. The rotor transfers heat over the shaft part from the second chamber to the head part and the fan dissipates the transferred heat to an environment.

9 Claims, 7 Drawing Sheets

(56) References Cited

U.S. PATENT DOCUMENTS

| | | | | |
|---|---|---|---|---|
| 4,262,483 | A | * | 4/1981 | DeGeus .................. F24S 10/95 60/671 |
| 6,019,165 | A | | 2/2000 | Batchelder |
| 6,209,631 | B1 | * | 4/2001 | Garcia-Ortiz ...... H05K 7/20336 165/274 |
| 6,814,134 | B1 | * | 11/2004 | Pravda ................ F28D 15/0208 165/104.21 |
| 2005/0117698 | A1 | * | 6/2005 | Lacey .................... A61B 6/035 378/19 |
| 2006/0066156 | A1 | * | 3/2006 | Dong ....................... H02K 9/20 310/54 |
| 2007/0098143 | A1 | * | 5/2007 | Thangamani ......... H01J 35/106 378/130 |
| 2008/0056749 | A1 | * | 3/2008 | Scheper ............. G03G 15/2053 399/69 |
| 2008/0197728 | A1 | | 8/2008 | Loussert et al. |
| 2009/0242174 | A1 | | 10/2009 | McCutchen et al. |

\* cited by examiner

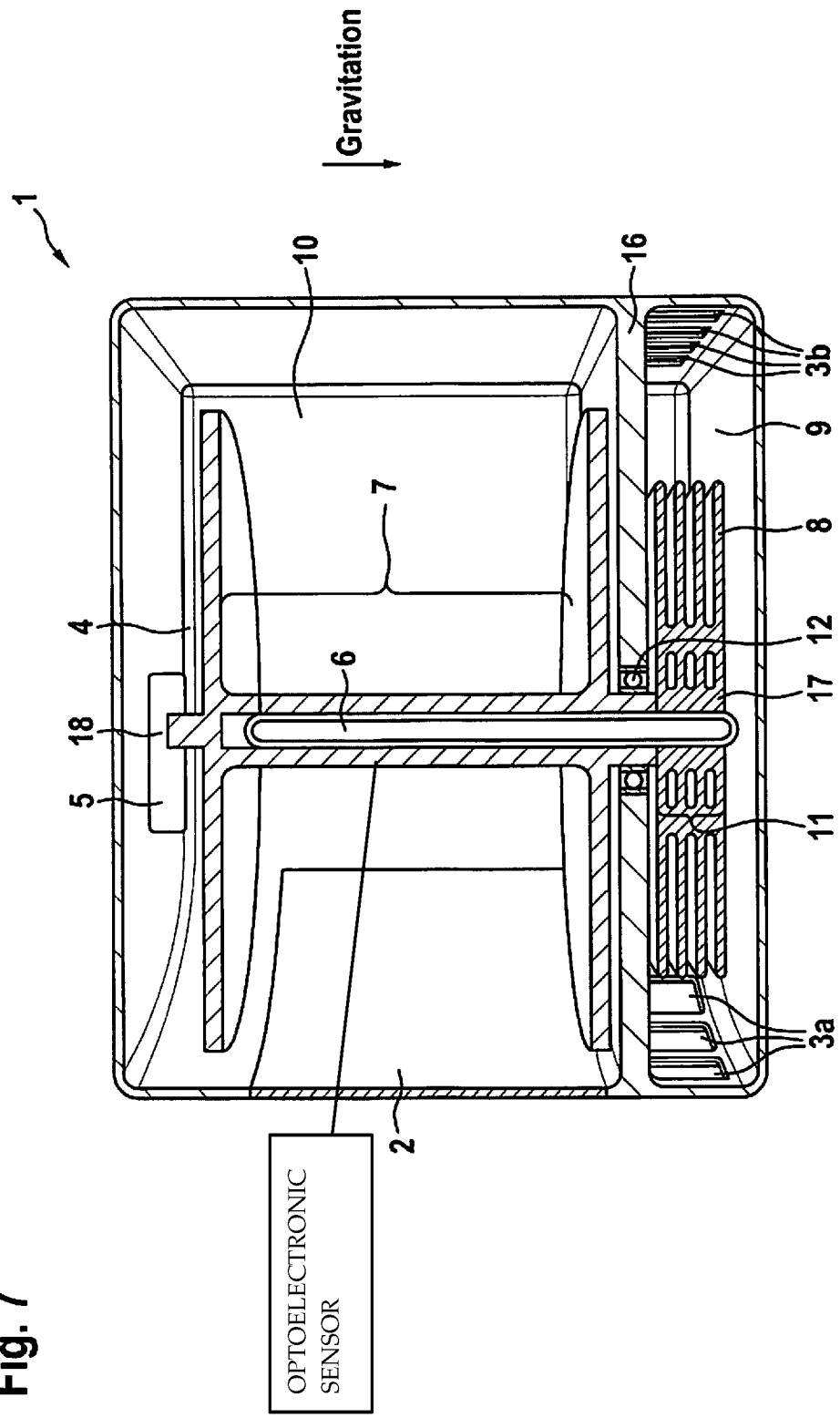

ENCLOSURE FOR AN OPTOELECTRONIC SENSOR AND LIDAR SENSOR

CROSS REFERENCE

The present application claims the benefit under 35 U.S.C. § 119 of European Patent Application No. EP 19165415.1 filed on Mar. 27, 2019, which is expressly incorporated herein by reference in its entirety.

FIELD

The present invention is concerned with an enclosure for an optoelectronic sensor and a LiDAR sensor.

BACKGROUND INFORMATION

In hermetically-sealed electronic devices, heat dissipation is usually performed by the housing itself, e.g., by conduction through the walls of the housing, using materials with suitable thermal conductivity (>15 W/(m K)). In these cases, small amounts of heated air inside of the electronic devices are not exploited in a way to result in an efficient convective heat-dissipation.

Systems, where there is a need to have rotational parts with electronics mounted on it (e.g., a LiDAR camera), comprising hermetically-sealed enclosures can face a big challenge in terms of thermal management.

U.S. Patent Application Publication No. US 2008/197728 A describes a heat sink for electronic components for a rotating electric machine. Here, a passive cooling process to remove heat from a rotating electronic device is performed with the help fins on the top and the bottom of the device.

U.S. Patent Application Publication No. US 2006/066156 A is concerned with a motor-rotor-cooling system with rotating heat pipes. The heat pipes are placed around a rotor for heat dissipation through phase-changing by vaporization of a liquid inside of the pipes. The heat dissipation also relies on centrifugal forces.

SUMMARY

According to a first aspect, the present invention is concerned with an enclosure for an optoelectronic sensor, in particular a LiDAR sensor. An "enclosure" can be understood as a housing in which components of a sensor can be placed. The enclosure can be understood as a stator which is not rotating. This however does not exclude that the enclosure can include rotating parts. The example enclosure according to the present invention comprises a first chamber which is a thermodynamically open system. The definition of "thermodynamically open" refers to the classical thermodynamic definition of a system which is capable of exchanging mass and energy, e.g., work and/or heat, with the environment. In other words, the first chamber can for example comprise air openings. The enclosure further comprises a second chamber which is arranged adjacent to the first chamber. The first and the second chamber can for example be separated by a separating portion. The second chamber is thermodynamically closed. In other words, according to the classical thermodynamic definition of a closed system, the second chamber is capable of exchanging energy, e.g., heat and/or work, with its environment, however, the second chamber is not capable of exchanging mass with its environment. The thermodynamically closed inner volume, i.e. system, of the second chamber is especially defined by walls of the second chamber and the shaft part of the rotor. The example enclosure according to the present invention comprises a rotor extending from the first chamber into the second chamber. Furthermore, the rotor in particular has a proximal end in the first chamber, wherein the rotor does in particular not comprise discontinuities in its spatial course. The rotor further extends through the separating portion arranged between the first and the second chamber. The rotor in addition extends into the second chamber, wherein the rotor in particular comprises a distal end in the second chamber. The rotor part in the first chamber is called "head part" and the rotor part in the second chamber is called "shaft part". The rotor can for example comprise a shape of a cylindrical rod which also includes elements surrounding this rod and which are fixedly mounted on this rod. Furthermore, the rotor especially extends parallel to the walls of the first chamber and the second chamber and coaxially to the rotational axis of the rotor. For example, if the enclosure has a cylindrical shape, the rotational axis of the rotor can extend through the center of the first circle face of the cylinder to the center of the second circle face of the cylinder. The rotor comprises a shaft part arranged coaxially to the rotational axis of the rotor. The shaft part is, in particular completely, arranged in the second chamber. The shaft part comprises means for mounting an optoelectronic sensor device. For example, the shaft part can be configured to be coupled with a transmitter and/or a receiver and/or a transceiver of an optoelectronic sensor. Furthermore, other electronic parts of an optoelectronic sensor can be mounted on the shaft part, as long as they are arranged on the shaft part in the second chamber. Since the second chamber is thermodynamically closed, no dust or moisture or particles can enter the second chamber. The second chamber can include a window which is permeable for light of a defined wavelength range. The wavelength range can be in the near infrared range (780 nm to 3 μm) or from 800 nm to 950 nm or 1450 nm to 1500 nm. Optionally, the wavelength range can be from 750 nm to 1700 nm. Furthermore, the rotor comprises a head part which is arranged coaxially to the rotational axis of the rotor in the first chamber. A heat dissipation fan is fixedly arranged on the head part and surrounding the head part, wherein the head part and the heat dissipation fan are rotatably and thermally coupled to the shaft part in order to rotate simultaneously with a shaft part around rotational axis of the rotor. The heat dissipation fan can for example comprise a propeller structure. In addition, the rotation of the shaft part and the head part are always identical to each other. The rotor is configured to transfer heat over the shaft part from the second chamber to the head part in the first chamber and the heat dissipation fan of the head part, since the heat dissipation fan and the head part are thermally coupled to the shaft part, wherein the heat dissipation fan of the head part is configured to dissipate heat transferred from the second chamber to the first chamber to the environment, since the first chamber is a thermodynamically open system, by an external air flow entering the first chamber and/or by creating a forced convection heat transfer due to its rotation. The rotational frequency of the rotor can be in the range of 100 rpm to 2000 rpm, especially 300 rpm to 1000 rpm. The airflow from the environment can for example enter the first chamber during a ride, when the enclosure for the optoelectronic sensor is mounted on a car. However, the forced convection can be generated by rotation of the heat dissipation fan itself. A temperature gradient is therefore generated between the shaft part in the second chamber and the heat dissipation structure of the heat dissipation fan in the first chamber, wherein the temperature increases along a way from the first chamber to the second chamber. Due to this gradient, a heat transfer by conduction from the shaft part to the head part is performed. The heat dissipation from the heat dissipation fan into the environment is driven by convection, e.g., by air flowing inside of the open chamber and/or by forced convection of caused by the rotation of the heat dissipation fan itself. In order to further facilitate heat transfer, the shaft part of the rotor can be formed of a material which possesses a high thermal conductivity like for example copper and/or aluminum and/or steel. The shaft part can for example be made of a full metal cylinder. Furthermore, the shaft part can also comprise ribs in order to facilitate the heat transfer from heat containing air which can be present in the second chamber to the shaft part. Thus, large amounts of heat (>50 W) which can be produced within the second chamber, if, e.g., electronic parts are present, can be dissipated without negatively affecting the function of the electronic parts. Due to the example rotor arrangement in accordance with the present invention and the temperature gradient produced by the rotation of the heat dissipation fan, the heat dissipation capability of the rotor can be improved compared to the heat dissipation capability of rotors arranged inside of closed chambers of conventional devices. Furthermore, the heat generated inside the second chamber is conductively dissipated to the outside of the enclosure which is more effective than internal convection, because internal convection cases an additional large thermal resistance. Furthermore, usual cooling methods based on an internal heat dissipation need large surface areas on the inside and the outside of the device to have a proper heat transfer. Using the example enclosure in accordance with the present invention, the size of the devices can therefore be scaled down due to its advantageous heat transfer characteristics caused by the temperature gradient as discussed above. The enclosure of the present invention can be metallic or polymeric. For example, the enclosure of the present invention can comprise a low conductive polymeric material with a thermal conductivity of <20 W/(m K).

Advantageous variants of the present invention are described herein.

The heat dissipation fan can comprise various structures. For example, the heat dissipation fan can comprise a laminar disc-like structure, which can comprise spatially separated discs which can be stacked in a stacking direction coaxially to the rotational axis with the head part as a center. The discs can also be mounted on the head part. For example, the discs can center the head part, wherein the head part can have the shape of a cylinder. The discs can comprise an arc-finned and/or a staggered pin protrusion structures on their circular surface. The spatially separated discs can be connected by plates and/or pins. Furthermore, the space between the discs can comprise voids and/or porous structures through which the air can flow.

A thermodynamically closed heat pipe can be arranged inside of the shaft part of the rotor. The heat pipe is configured to transfer heat from the second chamber to the heat dissipation fan. Therefore, the heat pipe extends from the inside of the shaft part to the inside of the head part. The heat pipe can for example contain a working fluid such as a gas (especially air and/or helium and/or nitrogen) in its internal volume. Furthermore or additionally the heat pipe can include a liquid depending on the operation temperatures like for example water and/or acetone and/or aqueous ammonia. Further or alternative components can be a CFC-based refrigerant (e.g., 1,1,1,2-tetrafluorethane) and/or an alkali metal (cesium and/or potassium and/or sodium) and/or methanol and/or ethane. A heat pipe envelope can for example comprise steel and/or copper and/or aluminum and/or superalloys.

The heat pipe can also extend up to the head part which additionally increases the quality of the heat transfer from the shaft part into the head part. Furthermore, more than one heat pipe, especially two to twelve heat pipes, can be arranged inside of the rotor. The heat pipes arranged in the shaft part do not extend into the second chamber. Due to the heat pipes arranged within the rotor, heat transfer over the rotor can be improved.

The heat pipe can include a liquid medium comprising ethanol, methanol, water, aqueous ammonia, acetone or a combination thereof in parts of its internal volume. Preferably, only a part of the volume of the heat pipe is filled with the liquid. An end of the heat pipe containing a liquid (depending on the arrangement of the enclosure) and from which a liquid is evaporated is called "evaporator". The liquid can evaporate by the heat present in the second chamber transferred into the shaft part and quickly transfer heat to the head part, wherein the liquid can condensate in the head part and dissipate the heat to the head part. The portion of the head part in which the liquid is condensed is called condenser. Consequently, the condensed liquid can flow back through the internal volume of the heat pipe into the shaft part. Using this effect, due to the latent heat of evaporation of the liquid higher amounts of heat can be transferred into the head part in an accelerated manner. Thus, the example enclosure in accordance with the present invention is capable of removing a high amount of heat generated inside of the second chamber (e.g. >50 W). Therefore, it becomes possible to use the enclosure for sensors without negatively affecting the sensors' function with respect to a wide temperature range, for example in case of the use as automotive sensors. Furthermore, the pipes can be arranged parallel or coaxially to the rotational axis of the rotor. In addition, the enclosure including an optoelectronic sensor device in the second chamber can be arranged in a manner that the shaft part has an orientation in which the gravitational forces help returning the condensate of the head part to a bottom part of the pipe (e.g. perpendicular to the direction of the gravitational force). In other words, the pipe can be arranged in a manner that the distal end of the rotor points into a direction in which a gravitational forces cause a flowing down of the liquid. Such variant of the present invention can be denoted as a thermosiphon. A thermosiphon especially does not need capillary forces to return a condensed liquid, since a thermosiphon uses gravitational forces. Furthermore, the pipe can also be constructed to use capillary forces so that the liquid can return to the part of the pipe which is arranged in the shaft part. The heat pipes can therefore comprise inner diameters of 3 mm to 6 mm.

According to preferred variant of the example enclosure in accordance with the present invention, the head part comprises a vapor chamber arranged in a center of the head part and the heat dissipation fan in which at least two heat pipes extending from the inside of the shaft part to the head part terminate. Besides, the heat pipes can comprise an opening through which the vapor chamber and the pipes are fluidly coupled to each other, whereby the vapor chamber and the heat pipes form a thermodynamically closed system. The diameter of the heat pipes and correspondingly the volume of the heat pipes are smaller than the volume of the vapor chamber. Due to the heat transfer mechanisms as discussed above, the vaporized liquid can be easily transferred from the heat pipes to vapor chamber where the heated liquid or gas can be expanded which facilitates the cooling of the gas or vaporized liquid due to relaxation and the volume expansion of the fluid taking place in the vapor chamber.

In a further variant of the example enclosure in accordance with the present invention, the shaft part comprises at least two closed heat pipes in its center, wherein each heat pipe can have different shapes. The heat pipes can for example extend parallel to each other or in V-like arrangement wherein the heat pipes converge in the head part and diverge in the shaft part. Alternatively or additionally, the heat pipes can extend parallel to the rotational axis starting in the head part, wherein the heat pipes diverge from each other perpendicularly to the rotational axis of the rotor in the shaft part until they reach the walls of the shaft part from where they further extend parallel to the rotational axis of the rotor, wherein the heat pipes change directions and extend parallel to the walls of the shaft part. In general, the shaft part can comprise an inner void volume without being open to the second chamber, wherein the void volume can for example have the shape of cuboid, a cube or a cylinder, in which the heat pipes are arranged. The void in particular comprises a volume which is larger than the volume of the heat pipes. Furthermore, the shaft part can also comprise a void without heat pipes. In this case further elements, for example electronics, can be arranged in the void.

In a further variant of the example enclosure in accordance with the present invention, the second chamber comprises a motor in its inner volume which is configured to transmit a rotational movement to the rotor. The motor can be, for example, arranged at a distal end of the rotor in the second chamber. Furthermore, the rotor can be arranged coaxially to the rotational axis of the rotor at its distal end. Cables for applying voltage to the rotor can for example be inserted through a wall of the second chamber. However the cables are sealed sufficiently in order to keep the second chamber thermodynamically closed.

Furthermore, the motor can be thermally coupled to the shaft part of the rotor. In this case, heat produced by the motor can be also transferred over the shaft part into the head part for dissipating heat. Thermally coupling motor and rotor can for example be realized by an adjacent arrangement of motor and rotor. Furthermore or additionally, the motor and the rotor can be coupled to each other.

In a further advantageous variant of the example enclosure in accordance with the present invention, the first chamber comprises air openings. The air openings can be arranged oppositely to each other with respect to the wall structure of the first chamber in order to allow air to pass over the heat dissipation fan. The openings connect the environment of the example enclosure in accordance with the present invention with the inner volume of the first chamber.

In another advantageous variant of the example enclosure in accordance with the present invention, a portion separating the first and the second chamber comprises a bearing which is configured to support a rotational movement of the rotor and which is nevertheless configured to thermodynamically close the second chamber. Due to the bearing in the portion separating the first and the second chamber the friction between the rotor and the separating portion during the rotor's rotation can be reduced and the long-term stability of the example enclosure in accordance with the present invention can be ensured. The bearing can for example be made of polymers and/or rubber. The bearing can comprise a graphite sealing. The bearing can prevent dust and water from entering the second chamber.

The further aspect includes the technical features, the advantages and the technical effects of the example enclosure in accordance with the present invention respectively.

According to a second aspect, the present invention relates to a LiDAR sensor comprising an enclosure according to the first aspect.

The following figures show further embodiments, variants and advantages of the present invention.

BRIEF DESCRIPTION OF THE DRAWINGS

In the following, variants of the present invention are described in detail with respect to the figures.

FIG. 7 shows a cross-sectional view of an inverted arrangement of the example enclosure in accordance with the present invention.

DETAILED DESCRIPTION OF EXAMPLE EMBODIMENTS

Figure 1A:
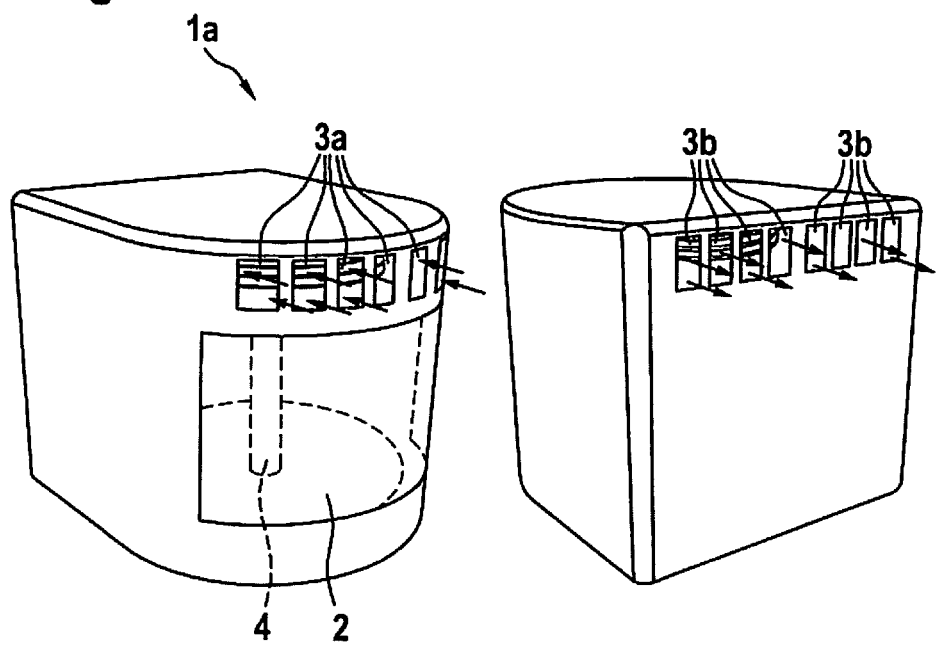
FIG. 1a shows a front and a rear view of a variant of an example enclosure in accordance with the present invention.

The left side of FIG. 1a shows a front view of an example enclosure 1a in accordance with the present invention. The example enclosure 1a comprises a cover 2 which is permeable for radiation with a wavelength in the range of 800 nm to 1000 nm. Furthermore, the enclosure 1a comprises a rotor 4. The front side of the enclosure 1a in addition comprises air openings 3a into which air can enter which is illustrated by the respective arrows. The right side of FIG. 1a shows a rear view of the enclosure 1a which also comprises air openings 3b arranged opposite to the air openings 3a through which air can exit.

Figure 1B:
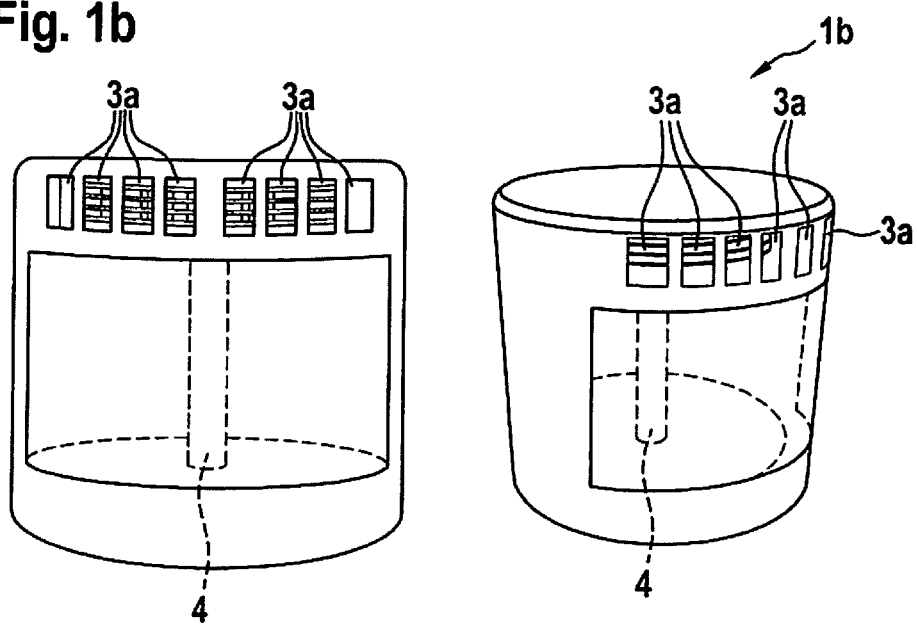
FIG. 1b shows a rear view of another variant of the example enclosure of the present invention.

FIG. 1b shows a further variant of the example enclosure 1b, wherein the enclosure 1b has a cylindrical shape. There are also front openings 3a into which air can enter in order to assist the cooling process. The enclosures of FIG. 1a and FIG. 1b are capable of including components for a LiDAR sensor. In other words, the enclosures 1a, 1b can be used as enclosures for LiDAR sensors.

Figure 2:
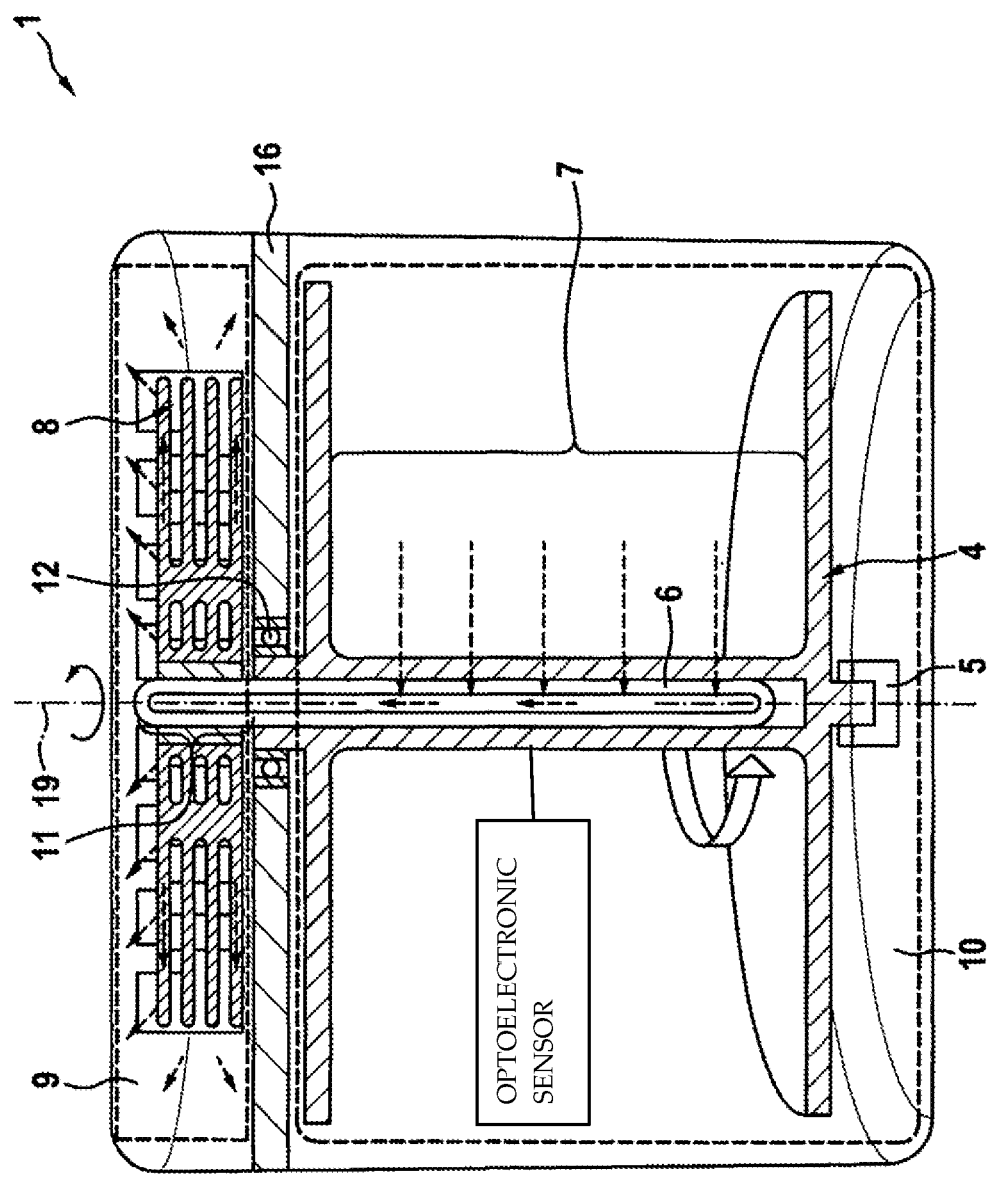
FIG. 2 shows a cross-sectional view of a variant of an example enclosure in accordance with the present invention.

FIG. 2 shows a cross-sectional view of a variant the example enclosure 1. The example enclosure 1 comprises a rotor 4 extending from the first chamber 9 in which the example rotor 4 comprises a head part 11 and a heat dissipation fan 8 over a separating portion 16 in which the rotor 4 is surrounded by bearing 12. The rotor 4 furthermore extends into the second chamber 10 which is a thermodynamically closed system. In contrast, the first chamber 9 is a thermodynamically open system. The rotor also includes a heat pipe 6 which furthermore includes a liquid, like for example water, within its inner volume. Heat generated in the second chamber 10 can be transferred over the rotor shaft 7 and the pipes 6 due to the vaporization of the liquid in the pipe, and due to conductive heat transportation, wherein the heat flow which is illustrated by the arrows, is transferred to the head part 11. Due to the rotational movement of the head part 11 and the heat dissipation fan 8 surrounding the head part 11, the heat transferred from the second chamber 10 into the first chamber 9 can be dissipated to an environment, since the first chamber 9 is an open system. The heat transfer from the second chamber 10 to the first chamber 9 is driven by a temperature gradient which is indicated as an arrow left to the enclosure 1 of FIG. 2.

Figure 3:
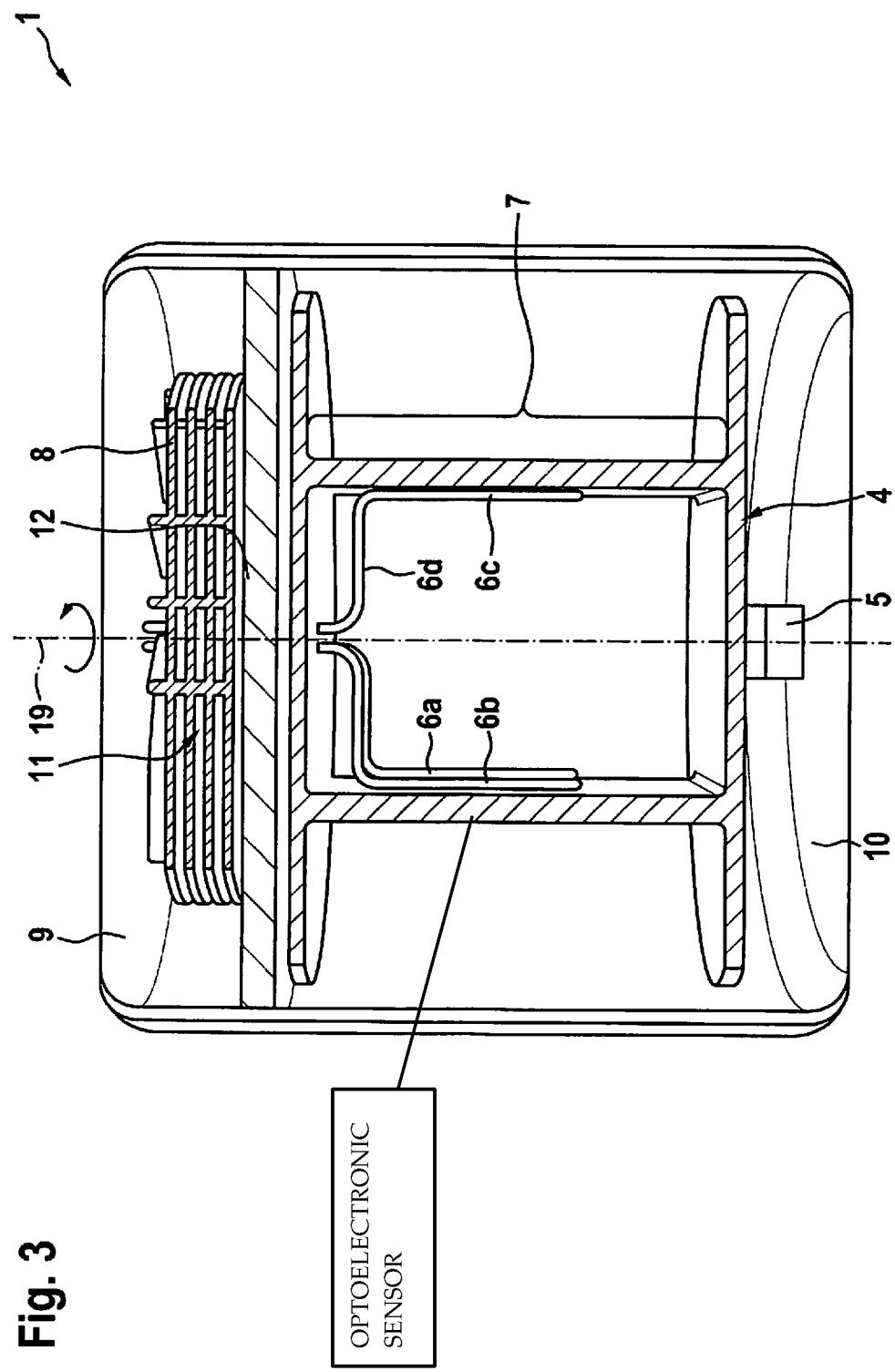
FIG. 3 shows a cross-sectional view of a further variant of the example enclosure in accordance with the present invention.

FIG. 3 shows another variant of the example enclosure 1. A motor 5, which is also present in FIG. 2, is configured to transmit a rotational movement to the rotor 4. A rotational axis 19 extends through the center of the rotor 4. The rotor 4 also contains a void in which an arrangement of four heat pipes 6a-6d is arranged. The heat pipes 6a-6d extend to the head part 11, wherein heat can be transferred due to the temperature gradient, shown for FIG. 2, to the heat dissipation fan 8.

Figure 4:
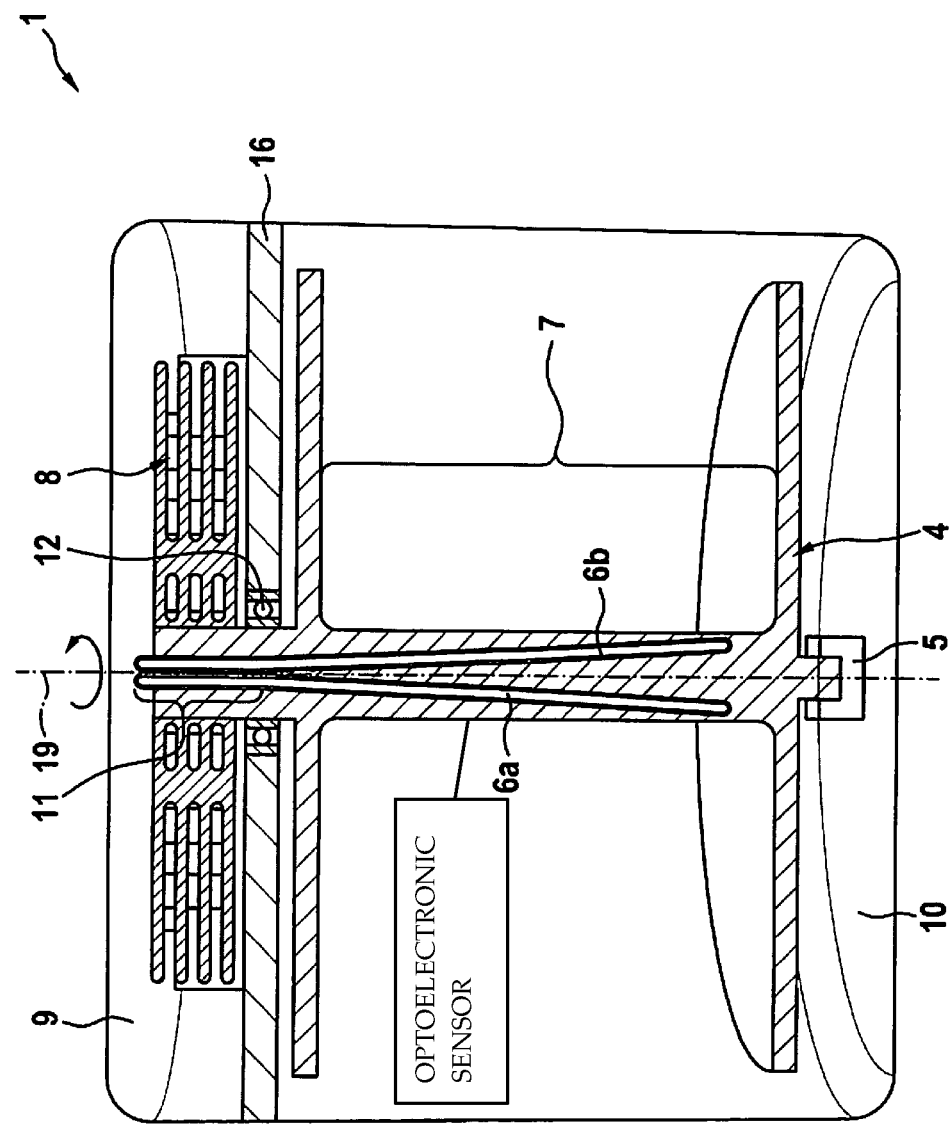
FIG. 4 shows a cross-sectional view of a variant of the example enclosure in accordance with the present invention with V-shaped pipes.

FIG. 4 shows a similar variant of the example enclosure 1. However, in this case the shaft 7 and the rotor 4 do not contain voids for the pipes 6a, 6b. The pipes 6a, 6b have a V-shaped arrangement which diverge in the second chamber 10 and converge with respect to an upwards direction coaxial to the rotational axis 19 of the rotor 4.

Figure 5:
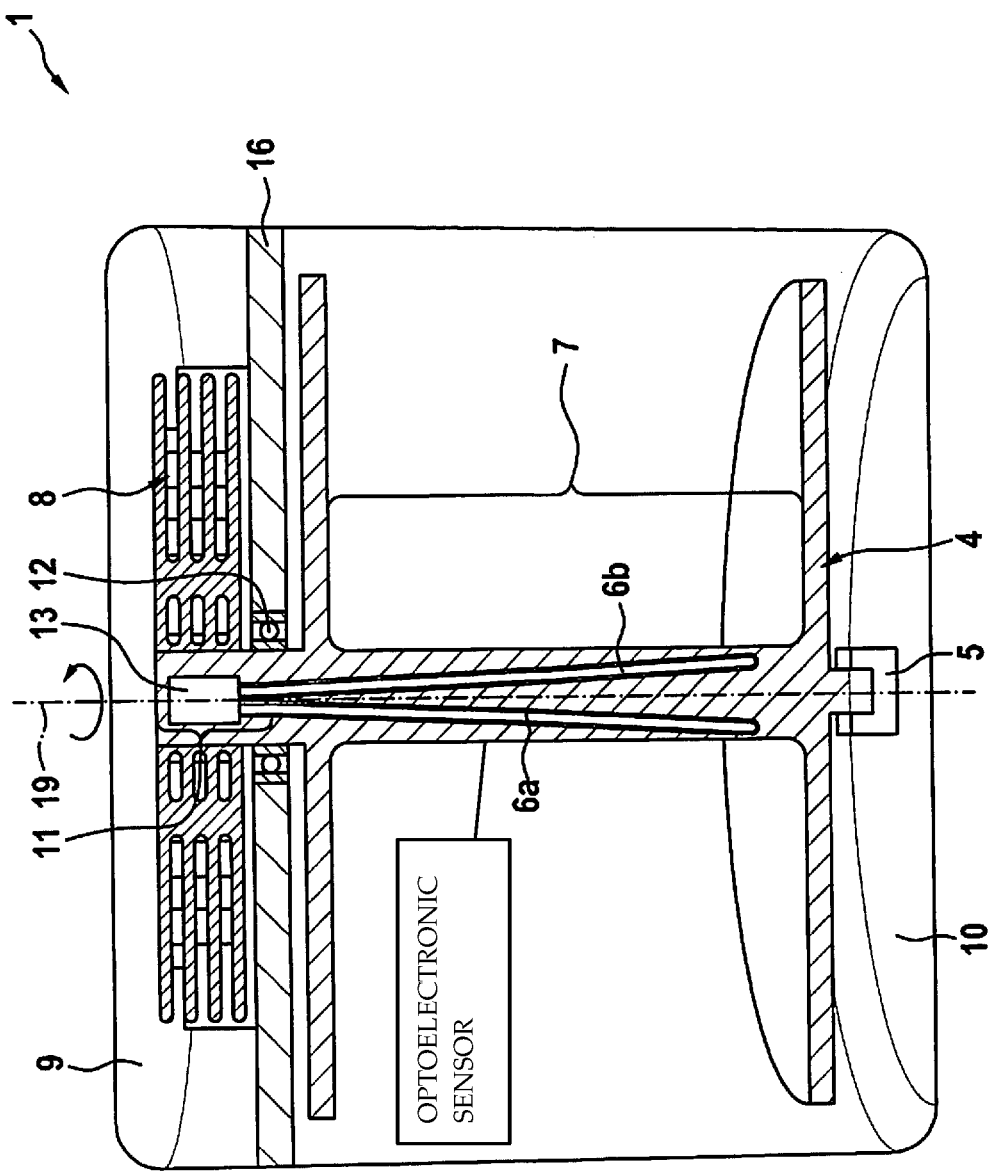
FIG. 5 shows a variant of the example enclosure in accordance with the present invention, having a thermosiphon chamber.

FIG. 5 shows a similar arrangement like in FIG. 4. In this case, a vapor chamber 13 is arranged in the head part 11. In addition, a bearing 12 is arranged in a separating portion 16 between the first chamber 9 and the second chamber 10.

Figure 6A:
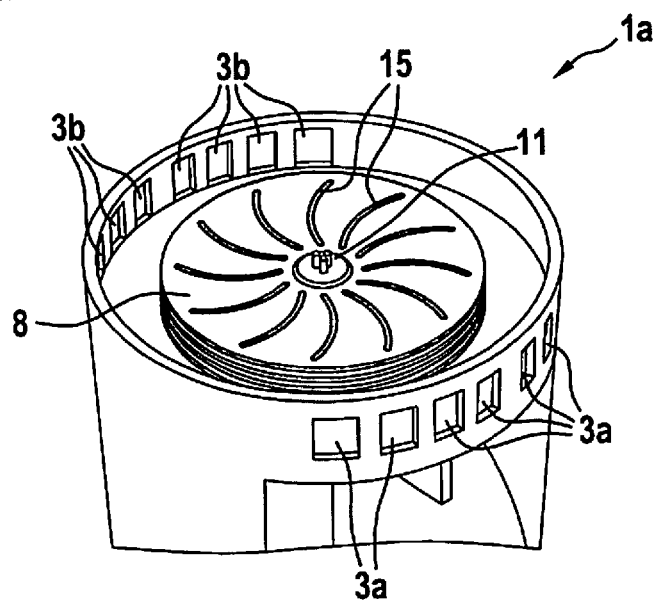
FIG. 6a shows an arc-finned heat dissipation fan.

FIG. 6a shows a variant of an example heat dissipation fan 8 in accordance with the present invention. The heat dissipation fan 8 has a disc-like structure which is surrounding the head part 11 of the rotor 4. The disc-like structure of the heat dissipation fan 8 comprises an arc-finned structure 15 in order to generate a forced convection due to the rotation of the rotor 4 and/or due to air entering the openings 3a. Acr-finned structures 15 can be arranged on each of the discs.

Figure 6B:
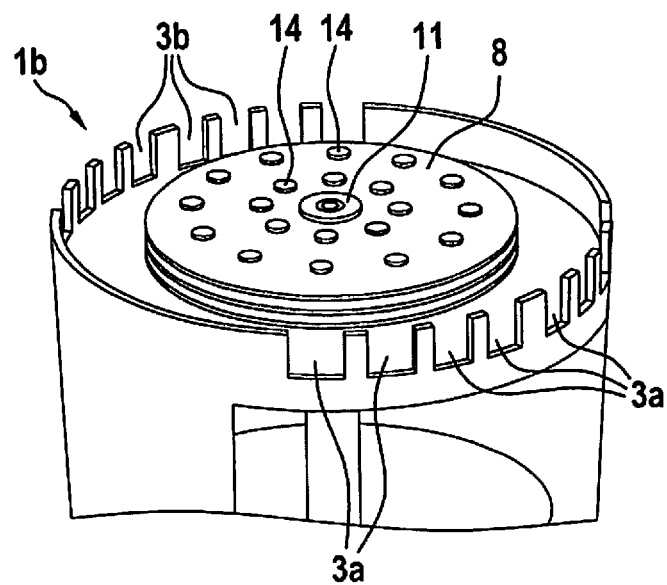
FIG. 6b shows a variant of a heat dissipation fan with staggered pins.

FIG. 6b shows an arrangement of a disc-like structure of a heat dissipation fan 8. Between the disc-like structure and on the top of the disc-like structure there are pins 14 in order to enhance the forced convection which is caused by the rotational movement of the head part 11 and the heat dissipation fan 8 respectively. Staggered pins can be arranged on each of the discs.

For both arrangements of FIGS. 6a and 6b, air openings 3a are provided in order to circulate air through the discs.

FIG. 7 shows a particular cross-sectional view of the example enclosure 1. The arrow right to the enclosure 1 pointing downwards illustrates the effective direction of the gravitational force. In this case, the enclosure 1 can be arranged into a sensor arrangement in a way that the gravitational forces apply in the direction shown by the arrow right to the Figure. Thus, the example enclosure 1 can be arranged in a sensor arrangement or in a robot or a car independent on the direction in which the enclosure is arranged or independent of the direction of the gravitational forces. In addition, the heat pipes can have a diameter of e.g. 2 mm so that a liquid can be transported by capillary forces.

What is claimed is:

1. An enclosure for an optoelectronic sensor, comprising:
    a first chamber which is thermodynamically open;
    a second chamber arranged adjacent to the first chamber; and
    a rotor which extends from the first chamber into the second chamber, wherein the rotor includes:
        a shaft part arranged in the second chamber coaxially to a rotational axis of the rotor, wherein the shaft part includes an arrangement configured to mount an optoelectronic sensor device; and
        a head part which is arranged in the first chamber coaxially to the rotational axis of the rotor, wherein a heat dissipation fan is fixedly arranged on the head part and surrounding the head part, the head part and the heat dissipation fan being rotatably and thermally coupled to the shaft part and rotate simultaneously with the shaft part around the rotational axis of the rotor;
    wherein the rotor is configured to transfer heat over the shaft part from the second chamber to the head part arranged in the first chamber, and the heat dissipation fan of the head part is configured to dissipate the heat, transferred from the second chamber to the first chamber over the rotor, to an environment, wherein the heat is dissipated to the environment by an external air flow entering the first chamber and/or by generating a forced convection heat transfer due to rotation of the rotor.

2. The enclosure according to claim 1, wherein at least one heat pipe is arranged inside of the shaft part, the at least one heat pipe being configured to transfer heat from the second chamber to the heat dissipation fan.

3. The enclosure according to claim 2, wherein the at least one of the at least one heat pipe extends into the head part.

4. The enclosure according to claim 2, wherein the at least one heat pipe includes a liquid medium, in an internal volume of the at least one heat pipe, comprising ethanol, and/or methanol, and/or water, and/or aqueous ammonia, and/or acetone.

5. The enclosure according to claim 2, wherein the head part includes a vapor chamber arranged in a center of the head part coaxially to the rotational axis of the rotor, wherein the at least one heat pipe includes at least two heat pipes that extend from an internal volume of the shaft part and terminate into the vapor chamber, and the at least two heat pipes are fluidly coupled to each other, to form a system within the rotor.

6. The enclosure according to claim 3, wherein the at least one heat pipe includes at least two heat pipes in a center of the shaft part, wherein the at least two heat pipes extend parallel to each other and parallel to the rotational axis of the rotor (4) and/or in a V-like arrangement, and wherein the at least two heat pipes diverge in the shaft part with respect to the rotational axis in a direction extending away from the head part.

7. The enclosure according to claim 1, wherein a motor is configured to transmit a rotational movement to the rotor, and the motor is arranged adjacently to the shaft part in the second chamber.

8. The enclosure according to claim 1, wherein the first chamber includes air openings.

9. The enclosure according to claim 1, wherein a portion separating the first and the second chamber includes a bearing which is configured to support a rotational movement of the rotor and which is configured to keep the second chamber thermodynamically closed.

* * * * *